(12) United States Patent  
Wang

(10) Patent No.: US 8,822,304 B2
(45) Date of Patent: Sep. 2, 2014

(54) ISOLATION STRUCTURE PROFILE FOR GAP FILING

(71) Applicant: Taiwan Semiconductor Manufacturing Company, Ltd., Hsin-Chu (TW)

(72) Inventor: Shiang-Bau Wang, Pingzchen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/077,514

(22) Filed: Nov. 12, 2013

(65) Prior Publication Data

US 2014/0057409 A1 Feb. 27, 2014

Related U.S. Application Data

(62) Division of application No. 13/024,577, filed on Feb. 10, 2011, now Pat. No. 8,598,675.

(51) Int. Cl.
*H01L 21/76* (2006.01)

(52) U.S. Cl.
USPC .......................................... 438/424; 438/207

(58) Field of Classification Search
USPC .................................................. 438/424, 207
See application file for complete search history.

(56) References Cited

U.S. PATENT DOCUMENTS

| | | |
|---|---|---|
| 6,140,207 A | 10/2000 | Lee |
| 7,553,767 B2 | 6/2009 | Cho et al. |
| 8,120,094 B2 | 2/2012 | Liaw et al. |
| 2007/0194402 A1 | 8/2007 | Sandhu et al. |
| 2008/0318392 A1 | 12/2008 | Hung et al. |
| 2009/0072355 A1 | 3/2009 | Cheng et al. |

*Primary Examiner* — Douglas Menz
(74) *Attorney, Agent, or Firm* — Haynes and Boone, LLP

(57) ABSTRACT

An trench isolation structure and method for manufacturing the trench isolation structure are disclosed. An exemplary trench isolation structure includes a first portion and a second portion. The first portion extends from a surface of a semiconductor substrate to a first depth in the semiconductor substrate, and has a width that tapers from a first width at the surface of the semiconductor substrate to a second width at the first depth, the first width being greater than the second width. The second portion extends from the first depth to a second depth in the semiconductor substrate, and has substantially the second width from the first depth to the second depth.

20 Claims, 6 Drawing Sheets

ISOLATION STRUCTURE PROFILE FOR GAP FILLING

CROSS-REFERENCE

This application is a divisional of U.S. Ser. No. 13/024,577 filed Feb. 10, 2011, and titled, "Isolation Structure Profile for Gap Filling," the entire disclosure of which is incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, because a trench isolation structure's aspect ratio increases as device technology nodes scale down, filling the trench isolation structure, such as a shallow trench isolation (STI) structure, has become complex and costly. Conventional trench isolation structure profiles and processes for filling the trench isolation structures implement complex and costly combinations of etching, deposition, annealing, and curing processes to achieve adequate filling. Accordingly, although existing trench isolation structure profiles and methods for filling these trench isolation structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
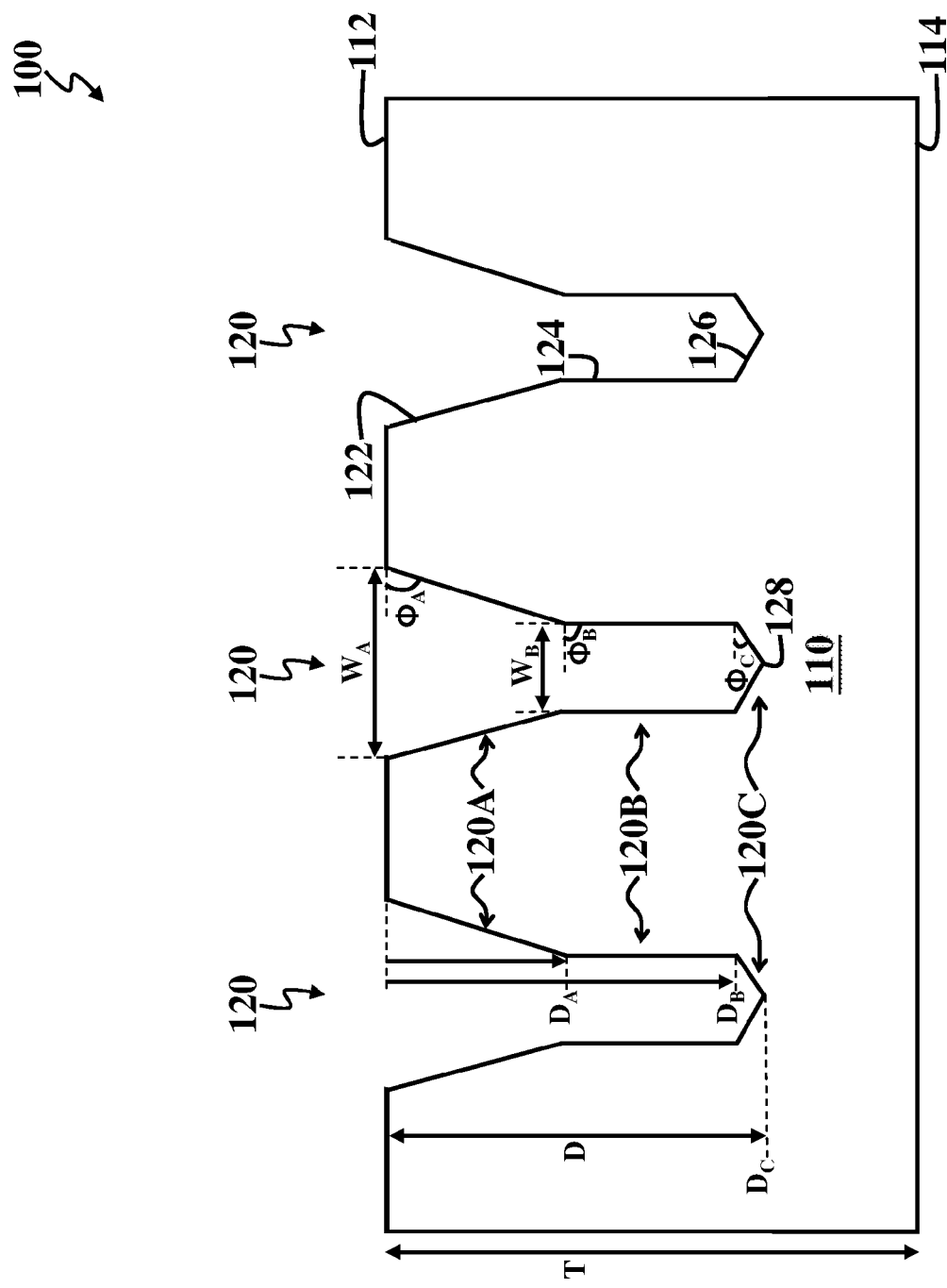
FIG. 1 is a diagrammatic cross-sectional view of an embodiment of a device that includes a trench isolation structure according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic cross-sectional view of an embodiment of a device 100 that includes a trench isolation structure according to various aspects of the present disclosure. FIG. 1 has been simplified for the sake of clarity to better understand the inventive concepts of the present disclosure. Additional features can be added in the trench isolation structure 100, and some of the features described below can be replaced or eliminated for additional embodiments of the trench isolation structure 100.

In FIG. 1, the device 100 includes a substrate 110. The substrate may be doped p-type or n-type. In the depicted embodiment, the substrate 110 is a semiconductor substrate including silicon. Alternatively or additionally, the substrate 110 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 110 may be a semiconductor on insulator (SOI). The substrate 110 may include a doped epi layer, a gradient semiconductor layer, and/or a semiconductor layer overlying another semiconductor layer of a different type, such as a silicon layer on a silicon germanium layer. The substrate 110 has a surface 112 and a surface 114 that is opposite the surface 112. A thickness, T, of the substrate 110 is measured between the surfaces 112 and 114.

The device 100 includes a trench isolation structure having trenches 120 disposed in the substrate 110. In the depicted embodiment, the trench isolation structure includes three trenches 120 disposed in the substrate 110. The trench isolation structure may include less trenches, for example only one, or more trenches, depending on design requirements of the device 100. For ease of discussion, the following will limit discussion to a single trench 120. In the depicted embodiment, the trench 120 extends from the substrate surface 112 to a depth, D, in the substrate 110. D is less than the thickness, T, of the substrate 110. In an example, the trench 120 has a depth, D, from about 1,000 Å to about 3,000 Å. As discussed further below, the trench 120 has a profile that enhances filling of the trench 120 with a material, such as a dielectric material.

More specifically, the trench 120 has a profile that includes a first portion 120A, a second portion 120B, and a third portion 120C.

The first portion 120A extends from the substrate surface 112 to a depth, $D_A$, in the substrate 110. In the depicted embodiment, the depth, $D_A$, is from about 100 Å to about 2,500 Å. A width of the first portion 120A tapers from the substrate surface 112 to the depth, $D_A$. For example, the first portion 120A has a width, $W_A$, at the substrate surface 112; a width, $W_B$, at the depth, $D_A$; and a width that ranges between $W_A$ and $W_B$ between the substrate surface 112 and the depth, $D_A$. In an example, $W_A$ is from about 15 nm to about 45 nm, and $W_B$ is about 5 nm to about 25 nm. The first portion 120A includes a sidewall 122 that extends at an angle, $\Phi_A$, from the substrate surface 112 to the depth, $D_A$. In the depicted embodiment, $\Phi_A$ between the substrate surface 112 and the sidewall 122 is less than about 85°. In another example, $\Phi_A$ between the substrate surface 112 and the sidewall 122 is less than or equal to about 83°.

The second portion 120B is disposed below the first portion 120A. The second portion 120B extends from the depth, $D_A$, in the substrate 110 to a depth, $D_B$, in the substrate 110. In the depicted embodiment, the depth, $D_B$, is from about 1,000 Å to about 3,000 Å. A width of the second portion 120B is substantially the same from depth, $D_A$, to depth, $D_B$. For example, the second portion 120B has a width of about $W_B$ from depth, $D_A$, to depth, $D_B$. In an example, as noted above, $W_B$ is about 5 nm to about 25 nm. The second portion 120B includes a sidewall 124 that extends from the sidewall 122 of the first portion 120A to the depth, $D_B$. The sidewall 124 is substantially perpendicular to the substrate surface 112. For example, an angle, $\Phi B$, between the substrate surface 112 and the sidewall 124 is less than about 120°. In the depicted embodiment, the angle, $\Phi_B$, between the substrate surface 112 and the sidewall 124 is about 90°.

The third portion 120C is disposed below the second portion 120B. The third portion 120C extends from the depth, $D_B$, in the substrate 110 to a depth, $D_C$, in the substrate 110. In the depicted embodiment, the depth, $D_C$, is equal to the depth, D, of the trench 120, and thus, the depth, $D_C$, is from about 1,000 Å to about 3,500 Å. A width of the third portion 120C tapers from the depth, $D_B$, to the depth, $D_C$. For example, the third portion 120C has the width, $W_B$, at the depth, $D_B$; a width that is about 0 at the depth, $D_C$; and a width that ranges between $W_B$ and 0 between the depth, $D_B$, and the depth, $D_C$. In an example, as noted above, $W_B$ is about 5 nm to about 25 nm. The third portion 120C includes a sidewall 126 that extends from the sidewall 124 to the depth, $D_C$. In the depicted embodiment, since the width of the third portion 120C tapers to about 0, the sidewall 128 tapers to a point 128. The point 128 may be rounded point or other suitable shaped point. Further, in the depicted embodiment, an angle, $\Phi_C$, between the substrate surface 112 and the sidewall 128 is less than or equal to about 45°.

Figure 2A:
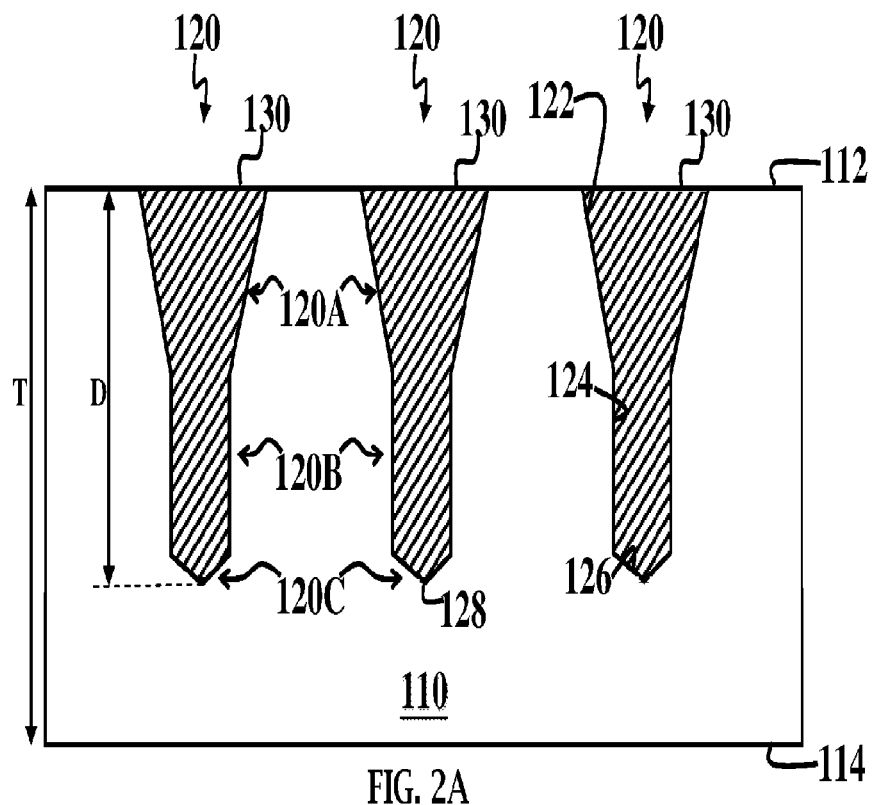
FIGS. 2A and 2B are diagrammatic cross-sectional views of the device of FIG. 1 according to various aspects of the present disclosure.
Figure 2B:
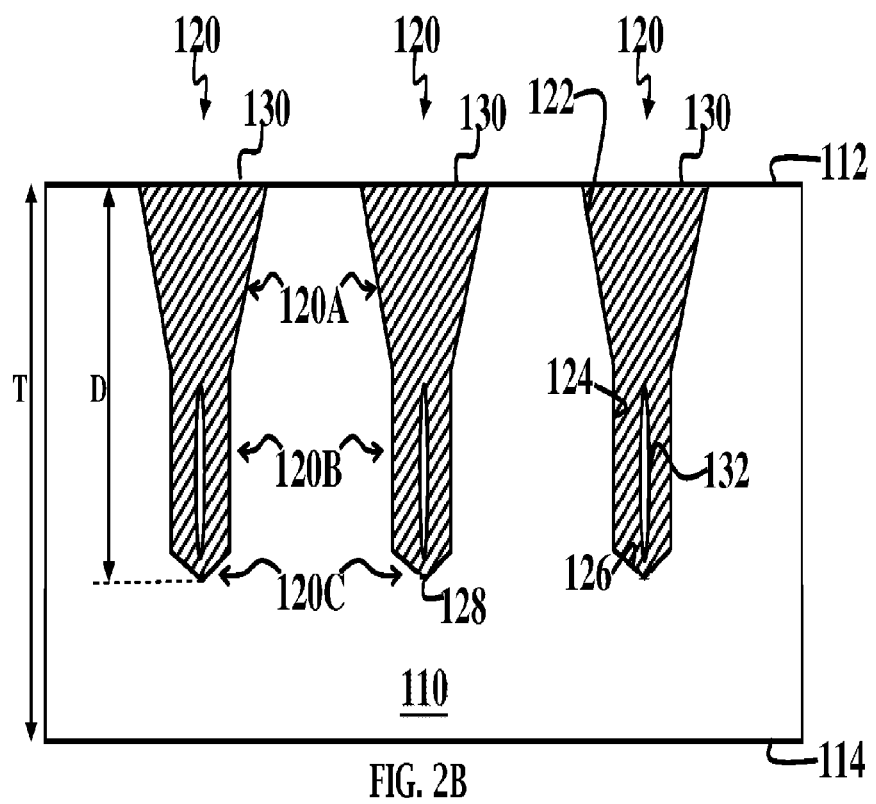

Referring to FIGS. 2A and 2B, the trenches 120 may be filled with an insulating material 130. The insulating material 130 includes a dielectric material, such as silicon oxide, silicon nitride, silicon oxynitride, other suitable materials, or combinations thereof. In the depicted embodiment, the insulating material 130 includes a high density plasma (HDP) oxide, a high aspect ratio process (HARP) oxide, a flowable chemical vapor deposition (CVD) oxide, or combinations thereof. The insulating material 130 that fills the trenches 120 may have a multi-layer structure, such as a thermal oxide liner layer formed on the sidewalls of the trenches 120 and a silicon nitride or silicon oxide layer formed over the thermal oxide liner layer. In the depicted embodiment, the filled trenches 120 isolate various regions of the substrate 110. For example, the filled trenches 120 may isolate various devices (not shown) of the device 100. In the depicted embodiment, the filled trenches 120 are shallow trench isolation (STI) structures that define and electrically isolate various regions of the device 100.

The disclosed trench profile facilitates complete filling of the trenches 120 as depicted in FIG. 2A, or the trench profile limits any void 132 formed in the trenches 120 to the second portion 120B and/or third portion 120C of the trenches 120. Confining any void 132 to the bottom portion of the trench, particularly the second portion 120B and/or third portion 120C, ensures that the void will not degrade device performance. For example, if the void 132 were to form in the first portion 130A, the void 132 would likely be filled with a conductive material during subsequent processing, which would degrade device performance. The disclosed trench profile thus facilitates filling of the trench 120 in a way that eliminates the void 132 or confines the void 132 to a portion of the trench 120 that will not interfere with device integrity. As discussed further below, since the disclosed trench profile promotes improved filling of the trench 120 using HDP oxide and HARP oxide deposition processes, the disclosed trench profile reduces manufacturing costs by requiring fewer and less costly processing steps than conventional trench profiles.

Figure 3:
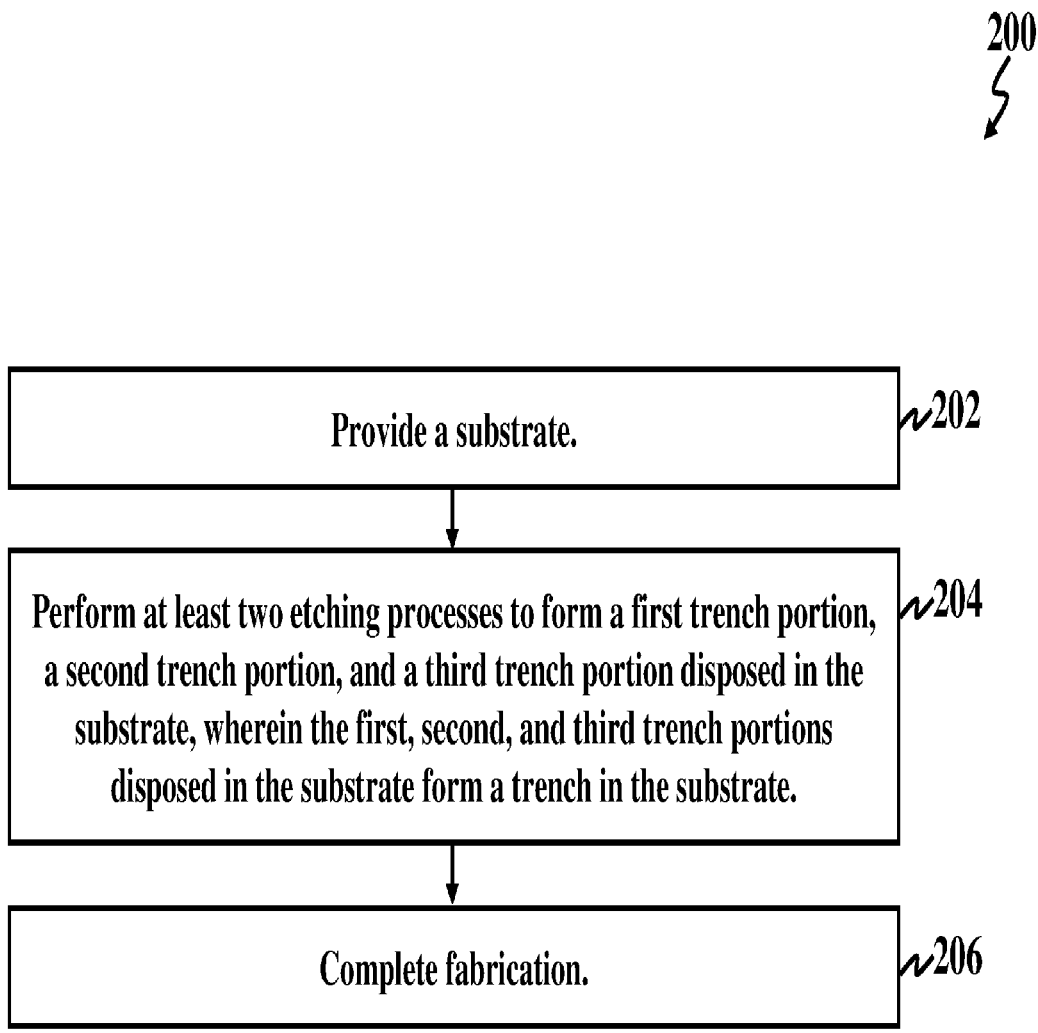
FIG. 3 is a flow chart of a method for fabricating a trench isolation structure according to various aspects of the present disclosure.

FIG. 3 is a flow chart of an embodiment of a method 200 for fabricating a trench isolation structure according to various aspects of the present disclosure. The method 200 begins at block 202 where a substrate is provided. At block 204, at least two etching processes are performed to form a first trench portion, a second trench portion, and a third trench portion disposed in the substrate. The first, second, and third trench portions disposed in the substrate form a trench in the substrate. The method 200 continues with block 206 where fabrication of the trench isolation structure is completed. For example, the trench may be filled with a dielectric material. In an example, the trench is filled with an oxide material formed by a HDP deposition process, a HARP deposition process, a flowable CVD process, other suitable deposition process, or combinations thereof. Additional steps can be provided before, during, and after the method 200, and some of the steps described can be replaced or eliminated for additional embodiments of the method. The discussion that follows illustrates various embodiments of the trench isolation structure that can be fabricated according to the method 200 of FIG. 3.

Figure 4:
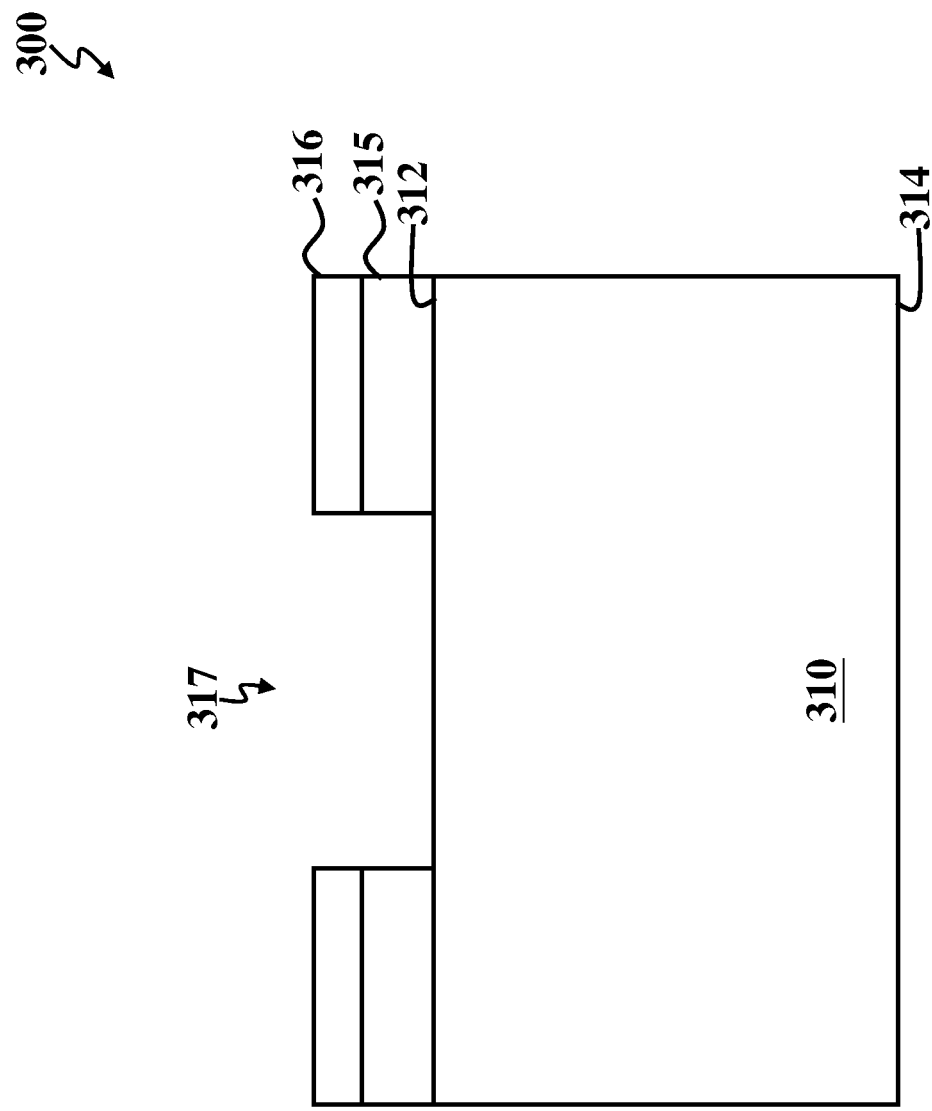
FIGS. 4-6 are various diagrammatic cross-sectional views of an embodiment of a device that includes a trench isolation structure during various fabrication stages according to the method of FIG. 3.
Figure 5:
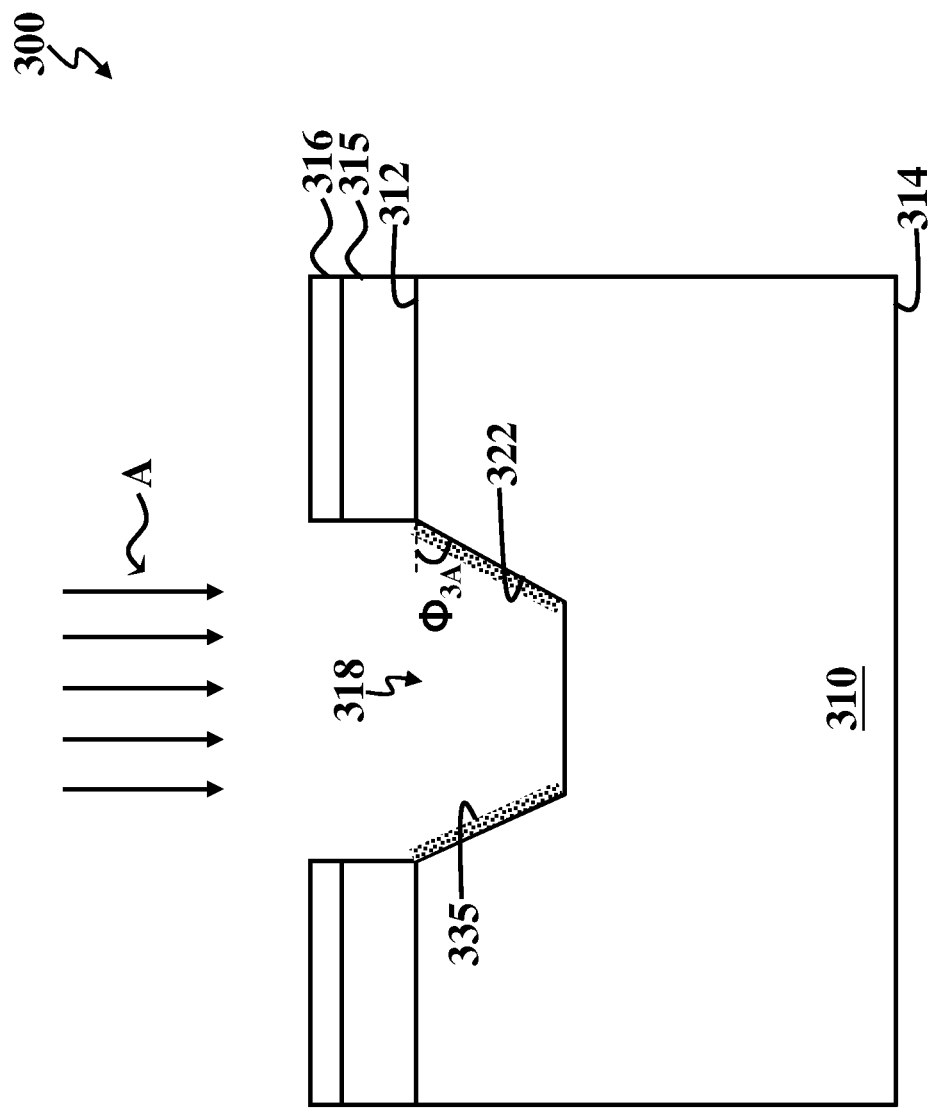
Figure 6:
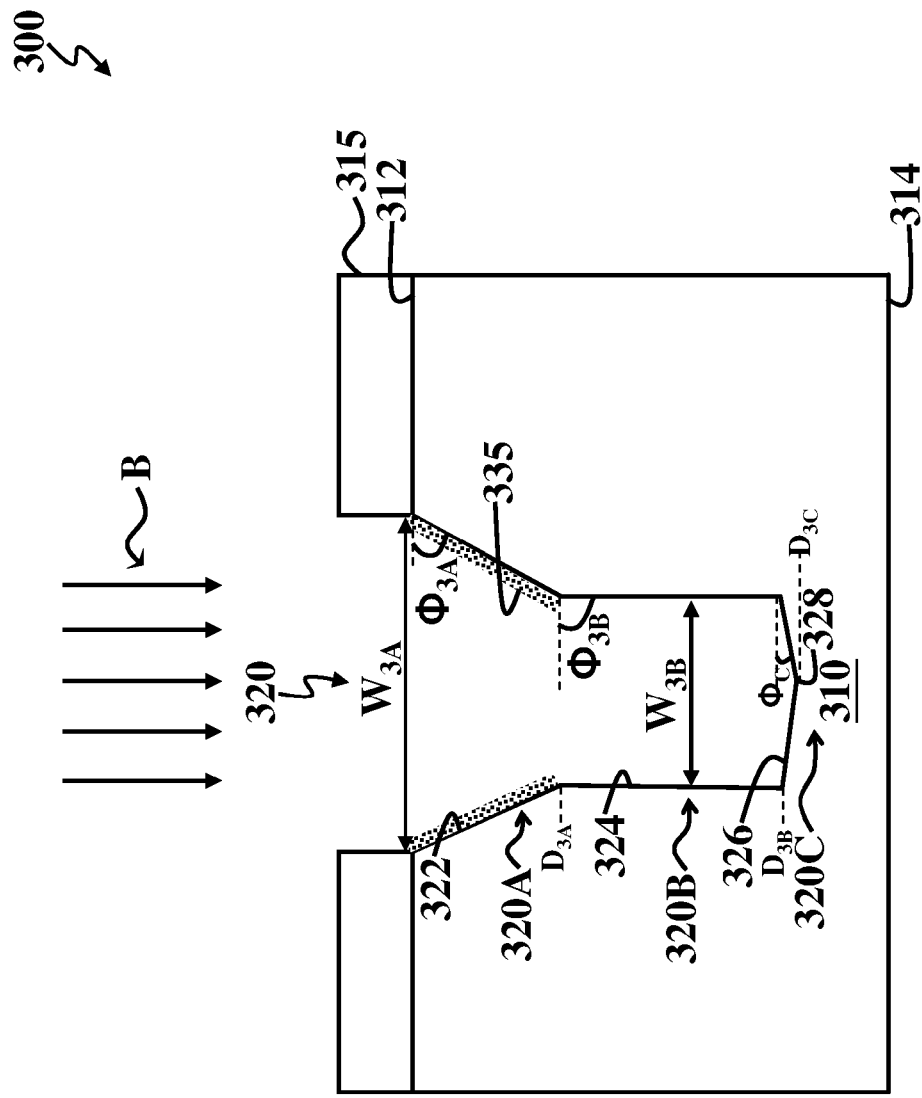

FIGS. 4-6 are various diagrammatic cross-sectional views of an embodiment of an integrated circuit device 300 during various fabrication stages according to the method 200 of FIG. 3. In the depicted embodiment, the integrated circuit device 300 includes a trench isolation structure. The integrated circuit device 200 may include an integrated circuit (IC) chip, system on chip (SoC), or portion thereof, that includes various passive and active microelectronic components, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, fin-like field effect transistors (FinFET), other suitable components, or combinations thereof. The trench isolation structure may isolate the various devices of the integrated circuit device 300. FIGS. 4-6 have been simplified for the sake of clarity to better understand the inventive concepts of the present disclosure. Additional features can be added in the integrated circuit device 300, and some of the features described below can be replaced or eliminated for additional embodiments of the integrated circuit device 300.

In FIG. 4, a substrate 310 is provided. In the depicted embodiment, the substrate 310 is a semiconductor substrate including silicon. The substrate may be doped p-type or n-type. Alternatively or additionally, the substrate 310 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 310 may be a semiconductor on insulator (SOI). The substrate 310 may include a doped epi layer, a gradient semiconductor layer, and/or a semiconductor layer overlying another semiconductor layer of a different type, such as a silicon layer on a silicon germanium layer.

In the depicted embodiment, the substrate 310 has a surface 312 and a surface 314 that is opposite the surface 312. A thickness of the substrate 310 is measured between the surfaces 312 and 314. The substrate may be a p-type or an n-type substrate depending on design requirements of the integrated circuit device 300. P-type dopants that the substrate 310 are doped with include boron, gallium, indium, other suitable p-type dopants, or combinations thereof. N-type dopants that the substrate 310 can be doped with include phosphorus, arsenic, other suitable n-type dopants, or combinations thereof. The substrate 310 may include various p-type doped regions and/or n-type doped regions. Doping may be implemented using a process such as ion implantation or diffusion in various steps and techniques.

A patterning layer 315 is disposed over the substrate surface 312, and a patterning layer 316 is disposed over the patterning layer 316. In the depicted embodiment, patterning layers 315 and 316 include a dielectric material, such as silicon oxide, silicon nitride, silicon oxynitride, other suitable dielectric material, or combinations thereof. For example, the patterning layer 315 is a silicon nitride layer, and the patterning layer 316 is an oxide layer. Alternatively, the patterning layer 315 and/or patterning layer 316 may be a resist, such as a photoresist. The patterning layers 315 and 316 include an opening 317 that exposes a portion of the substrate surface 312. The opening 317 may be formed by a lithography and etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process may be include maskless photolithography, electron-beam writing, or ion-beam writing. The etching processes include dry etching, wet etching, other etching methods, or combinations thereof. In an example, forming the opening 317 may include forming the patterning layers 315 and 316 over the substrate surface 312, forming a photoresist layer over the patterning layer 316, exposing and developing the photoresist layer to have an opening therein that exposes the patterning layer 316, and etching the exposed patterning layer 316 and underlying patterning layer 315 until the portion of the substrate surface 312 is exposed.

In FIG. 5, an etching process A removes exposed portions of the substrate 310 to form trench 318 in the substrate 310. The etching process A is controlled to achieve a desired profile of the trench 318. More specifically, the etching process A uses a polymer rich gas that is tuned to achieve a first trench portion (such as first trench portion 120A described with reference to FIGS. 1 and 2A-2B) having a tapered profile, such as that illustrated in FIG. 5. The trench 318 has a sidewall 322 that extends from the substrate surface 312 into the substrate 310. An angle, $\Phi_{3A}$, between the substrate surface 312 and the sidewall 322 is less than about 85°. In the depicted embodiment, the etching process A is a dry etching process. The dry etching process has etching parameters that can be tuned, such as etchants used, etching pressure, source power, radio-frequency (RF) bias voltage, RF bias power, etchant flow rate, and other suitable parameters. For example, an etching pressure of about 1 mT (milli-Torr) to about 50 mT may be used, a source power of about 500 W (Watts) to about 2,000 W, and an etchant that includes a carbon fluoride containing gas (such as $CH_2F_2$, $CH_3F$, $C_2F_6$, $C_3F_8$, $C_4F_6$, $C_4F_8$, or combinations thereof), a chlorine containing gas (such as $Cl_2$), an oxygen containing gas (such as $O_2$), a hydrogen containing gas (such as HBr, $CH_4$, or combinations thereof), other suitable gases, or combinations thereof may be used. In an example, the etching process A uses an etching pressure of about 1 mT to about 50 mT, a source power of about 500 W to about 2,000 W, an RF bias voltage of about 50 V (Volts) to about 300 V, a $CH_2F_2$ gas flow of about 15 sccm (standard cubic centimeters per minute) to about 45 sccm, a $Cl_2$ gas flow of about 40 sccm to about 120 sccm, an $O_2$ gas flow of about 5 sccm to about 20 sccm, and an HBr gas flow of about 200 sccm to about 500 sccm. The etching profile of the trench 318 has a suitable depth. During the etching process, a polymer layer 335 forms on sidewalls 322 of the trench 318. The polymer layer 335 will prevent subsequent etching processes from affecting the tapered profile of the trench 318, thereby ensuring that the angle, $\Phi_{3A}$, between the substrate surface 312 and the sidewall remains less than about 85°.

After the etching process A, portions of the substrate 310 remain exposed in the trench 318. In FIG. 6, an etching process B removes exposed portions of the substrate 310 to form trench 320 in the substrate 310. The etching process B uses a leaner chemistry than etching process A that is controlled to achieve a desired trench profile for the trench 320. More specifically, the etching process B is tuned to achieve a first trench portion 320A, a second trench portion 320B, and a third trench portion 320C. During the etching process B, the leaner chemistry can form a slight passivation layer that facilitates forming the second trench portion 320B with a vertical profile. Because etching process B uses a leaner chemistry, the etching process B (particularly gases used in the etching process) will generate less of a passivation layer on the trench sidewalls when compared to etching process B. In the depicted embodiment, the etching process B is a dry etching process. The dry etching process has etching parameters that can be tuned, such as etchants used, etching pressure, source power, radio-frequency (RF) bias voltage, RF bias power, etchant flow rate, and other suitable parameters. Particularly, the etching process may be tuned to achieve a vertical profile of second trench portion 320B of the trench 320. For example, an etching pressure of about 1 mT (milli-Torr) to about 50 mT may be used, a source power of about 200 W (Watts) to about 1,000 W, and an etchant that includes a fluorine containing gas (such as $SF_6$, $CH_2F_2$, $CF_4$, $CH_3F$, $C_2F_6$, $C_3F_8$, $C_4F_6$, $C_4F_8$, $NF_3$, or combinations thereof), a chlorine containing gas (such as $Cl_2$), a nitrogen containing gas (such as $N_2$), an oxygen containing gas (such as $O_2$), a hydrogen containing gas (such as HBr, $CH_4$, or combinations thereof), a helium containing gas (such as He), other suitable gasses, or combinations thereof may be used. In an example, the etching process B uses an etching pressure of about 1 mT to about 50 mT, a source power of about 200 W to about 1,000 W, an RF bias voltage of about 20 V (Volts) to about 200 V, an $SF_6$ gas flow of about 20 sccm to about 100 sccm, a $CH_2F_2$ gas flow of about 30 sccm to about 100 sccm, a $N_2$ gas flow of about 30 sccm to about 150 sccm, an He gas flow of about 50 sccm to about 300 sccm.

In FIGS. 5 and 6, the etching processes A and B achieve a trench profile that enhances subsequent filling of the trench 320. The first portion 320A, second portion 320B, and third portion 320C form a funnel-shaped trench profile that has a vertical portion positioned between two tapered portions. The first portion 320A extends from the substrate surface 312 to a depth, $D_{3A}$, in the substrate 310. In the depicted embodiment, the depth, $D_{3A}$, is from about 100 Å to about 2,500 å. A width of the first portion 320A tapers from the substrate surface 312 to the depth, $D_{3A}$. For example, the first portion 320A has a width, $W_{3A}$, at the substrate surface 312; a width, $W_{3B}$, at the depth, $D_{3A}$; and a width that ranges between $W_{3A}$ and $W_{3B}$ between the substrate surface 312 and the depth, $D_{3A}$. In an example, $W_{3A}$ is from about 15 nm to about 45 nm, and $W_{3B}$ is about 5 nm to about 25 nm. The first portion 320A includes the sidewall 322 that extends at the angle, $\Phi_{3A}$, from the substrate surface 312 to the depth, $D_{3A}$. As noted above, to the depicted embodiment, $\Phi_A$ between the substrate surface 312 and the sidewall 322 is less than about 85°. In another example, $\Phi_A$ between the substrate surface 312 and the sidewall 322 is less than or equal to about 83°.

The second portion 320B is disposed below the first portion 320A. The second portion 320B extends from the depth, $D_{3A}$, in the substrate 310 to a depth, $D_{3B}$, in the substrate 310. In the depicted embodiment, the depth, $D_{3B}$, is from about 100 Å to about 3,000 Å. A width of the second portion 320B is substantially the same from depth, $D_{3A}$, to depth, $D_{3B}$. For example, the second portion 320B has a width of about $W_{3B}$ from depth, $D_{3A}$, to depth, $D_{3B}$. In an example, as noted above, $W_{3B}$ is about 5 nm to about 25 nm. The second portion 320B includes a sidewall 324 that extends from the sidewall 322 of the first portion 320A to the depth, $D_{3B}$. The sidewall 324 is substantially perpendicular to the substrate surface 312. For example, an angle, $\Phi_B$, between the substrate surface 112 and the sidewall 124 is less than about 120°. In the depicted embodiment, the angle, $\Phi_B$, between the substrate surface 112 and the sidewall 124 is about 90°.

The third portion 320C is disposed below the second portion 320B. The third portion 320C extends from the depth, $D_{3B}$, in the substrate 310 to a depth, $D_{3C}$, in the substrate 310. In the depicted embodiment, the depth, $D_{3C}$, is a depth of the trench 320. In an example, the depth, $D_{3C}$, is from about 1,000 Å to about 3,500 Å. A width of the third portion 320C tapers from the depth, $D_{3B}$, to the depth, $D_{3C}$. For example, the third portion 320C has the width, $W_{3B}$, at the depth, $D_{3B}$; a width that is about 0 at the depth, $D_{3C}$; and a width that ranges between $W_{3B}$ and 0 between the depth, $D_{3B}$, and the depth, $D_{3C}$. In an example, as noted above, $W_{3B}$ is about 5 nm to about 25 nm. The third portion 320C includes a sidewall 326 that extends from the sidewall 324 to the depth, $D_{3C}$. In the depicted embodiment, since the width of the third portion 320C tapers to about 0, the sidewall 328 tapers to a point 328. The point 328 may be rounded point or other suitable shaped point. Further, in the depicted embodiment, an angle, $\Phi_{3C}$, between the substrate surface 312 and the sidewall 328 is less than or equal to about 45°.

The disclosed trench profile of the trench 320, which is achieved by the etching processes A and B, facilitates adequate filling of the trench 320 using conventional insulating materials, such as a dielectric material. For example, the trench 320 may be filled with silicon oxide, silicon nitride, silicon oxynitride, other suitable materials, or combinations thereof. In an example, the insulating material filling the trench 320 includes a HDP oxide, a HARP oxide, a flowable CVD oxide, or combinations thereof. The insulating material that fills the trench 320 may have a multi-layer structure, such as a thermal oxide liner layer formed on the sidewalls of the trenches 320 and a silicon nitride or silicon oxide layer formed over the thermal oxide liner layer. The filled trench 320 isolates various regions of the substrate 310. In an example, the filled trench 320 may be a shallow trench isolation (STI) structure that defines and electrically isolates various regions of an integrated circuit device.

The disclosed trench profile of the trench 320 facilitates complete filling of the trench, or confines any void formed in the insulating material to the second portion 320B and/or third portion 320C of the trench 320. Confining voids to the bottom portion of the trench, particularly the second portion 320B and/or third portion 320C, ensures that the void will not degrade device performance. The disclosed trench profile thus facilitates filling of the trench 320 in a way that eliminates voids or confines voids to a portion of the trench 320 that will not interfere with device integrity. Since the disclosed trench profile promotes improved filling of the trench 320 using HDP oxide and HARP oxide deposition processes, the disclosed trench profile eliminates the need for more complex and costly processes used to fill trenches at smaller technology nodes, such as 20 nm technology nodes and below. Instead, the disclosed trench profile is formed and filled with reduced manufacturing costs. It is understood that different embodiments may have different advantages, and that no particular advantage is necessarily required of any embodiment.

The present disclosure provides for many different embodiments. For example, a trench isolation structure includes a first trench isolation portion, a second trench isolation portion, and third trench isolation portion. The first trench isolation portion has a first sidewall that extends from a surface of a semiconductor substrate to a first depth in the semiconductor substrate, where a first angle between the first sidewall and the surface of the semiconductor substrate is less than or equal to about 85°. The second trench isolation portion has a second sidewall that extends from the first sidewall at the first depth to a second depth in the semiconductor substrate, where a second angle between the second sidewall and the surface of the semiconductor substrate is about 90°. The third trench isolation portion has a third sidewall that extends from the second sidewall at the second depth to a third depth in the semiconductor substrate, where a third angle between the third sidewall and the surface of the semiconductor substrate is less than 90°, for example, less than or equal to about 45°.

The first trench isolation portion may have a width that tapers from a first width at the surface of the semiconductor substrate to a second width at the first depth, the first width being greater than the second width. The second trench isolation portion may have a width that is substantially equal to the second width from the first depth to the second depth. The third trench isolation portion may have a width that tapers from the second width at the second depth to a third width at the third depth, the second width being greater than the third width. A bottom portion of the third isolation portion may be a rounded point. The first, second, and third trench isolation portions may be filled with an insulating material. Any void in the insulating material may be confined within the second trench isolation portion, third trench isolation portion, or both the second and third trench isolation portions.

In another example, a device includes a semiconductor substrate and a trench in the semiconductor substrate. The trench includes a first portion, a second portion, and a third portion. The first portion extends from a surface of a semiconductor substrate to a first depth in the semiconductor substrate, and has a width that tapers from a first width at the surface of the semiconductor substrate to a second width at the first depth, the first width being greater than the second width. The second portion extends from the first depth to a second depth in the semiconductor substrate, and has substantially the second width from the first depth to the second depth. The third portion extends from the second depth to a third depth in the semiconductor substrate, and has a width that tapers from the second width at the second depth to a third width at the third depth, the second width being greater than the third width.

The first portion may include a tapered sidewall, where an angle between the surface of the semiconductor substrate and the tapered sidewall is less than about 85°. The second portion may include a sidewall, where an angle between the surface of the semiconductor substrate and the sidewall is less than about 120°. The third portion may include a tapered sidewall, where an angle between the surface of the semiconductor substrate and the tapered sidewall is less than 90°, for example, less than or equal to about 45°. The first depth may be from about 100 Å to about 2,500 Å, and the third depth may be from about 1000 Å to about 3,000 Å. The third width may be about 0, such that a bottom portion of the trench is a point. The device may further include a dielectric material disposed in the trench. The trench may be a shallow trench isolation (STI) structure.

In yet another example, a method includes providing a semiconductor substrate, performing at least two etching processes to form a trench in the semiconductor substrate, and filling the trench with a material. Performing the at least two etching processes includes performing a first etching process to form a first trench portion, and performing a second etching process to form a second trench portion and a third trench portion. The first trench portion extends from a surface of the semiconductor substrate to a first depth in the semiconductor substrate, wherein the first portion has a width that tapers from a first width at the surface of the semiconductor substrate to a second width at the first depth, the first width being greater than the second width. The second trench portion extends from the first depth to a second depth in the semiconductor substrate, wherein the second portion has substantially the second width from the first depth to the second depth. The third portion extends from the second depth to a third depth in the semiconductor substrate, wherein the third portion has a width that tapers from the second width at the second depth to a third width at the third depth, the second width being greater than the third width. Performing the first etching process and the second etching process may include using a carbon fluoride gas. In an example, performing the first etching process includes using an etching recipe that includes a $CH_2F_2$ gas, a $Cl_2$ gas, a $O_2$ gas, and a HBr gas. In an example, performing the second etching process includes using an etching recipe that includes a $CH_2F_2$ gas, a $SF_6$ gas, a $N_2$ gas, and a He gas. Filling the trench with the material may include depositing a high aspect ratio process (HARP) oxide or a high density plasma (HDP) oxide in the trench. In an example, before depositing the HARP oxide or HDP oxide, a flowable chemical vapor deposition (CVD) process is performed to form a flowable CVD oxide in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a semiconductor substrate; and
performing at least two etching processes to form a trench in the semiconductor substrate, wherein the performing the at least two etching processes includes:
performing a first etching process to form a first trench portion extending from a top surface of the semiconductor substrate to a first depth in the semiconductor substrate, wherein the first trench portion has a width that tapers from a first width at the surface of the semiconductor substrate to a second width at the first depth, the first width being greater than the second width, and
performing a second etching process to form a second trench portion and a third trench portion, the second trench portion extending from the first depth to a second depth in the semiconductor substrate, wherein the second trench portion has substantially the second width from the first depth to the second depth, and the third trench portion extending from the second depth to a third depth in the semiconductor substrate, wherein the third trench portion has a width that tapers from the second width at the second depth to a third width at the third depth, the second width being greater than the third width, wherein the third trench portion is defined by a first sidewall extending from the second depth to the third depth and an opposing second sidewall extending from the second depth to the third depth such that the first sidewall intersects the second sidewall at the third depth, wherein an entire length of the first sidewall extending from the second depth to the third depth is transverse to the top surface of the semiconductor substrate; and
filling the trench with a material.

2. The method of claim 1 wherein the performing the first etching process and the second etching process includes using a carbon fluoride gas.

3. The method of claim 1 wherein the performing the first etching process includes using an etching recipe that includes a $CH_2F_2$ gas, a $Cl_2$ gas, a $O_2$ gas, and a HBr gas.

4. The method of claim 1 wherein the performing the second etching process includes using an etching recipe that includes a $CH_2F_2$ gas, a $SF_6$ gas, a $N_2$ gas, and a He gas.

5. The method of claim 1 wherein the filling the trench with the material includes depositing a high aspect ratio process (HARP) oxide or a high density plasma (HDP) oxide in the trench.

6. The method of claim 5 wherein the filling the trench with the material includes, before depositing the HARP oxide or HDP oxide, performing a flowable chemical vapor deposition (CVD) process.

7. The method of claim 1, wherein an entire length of the second sidewall extending from the second depth to the third depth is transverse to the top surface of the semiconductor substrate.

8. A method comprising:
forming a first trench portion in a semiconductor substrate, wherein the first trench portion has a first sidewall that extends from a surface of the semiconductor substrate to a first depth in the semiconductor substrate, wherein the first trench portion includes a first angle between the first sidewall and the surface of the semiconductor substrate;

forming a second trench portion in the semiconductor substrate, wherein the second trench portion has a second sidewall that extends from the first sidewall at the first depth to a second depth in the semiconductor substrate, wherein the second trench portion includes a second angle between the second sidewall and the surface of the semiconductor substrate, wherein the first angle is less than the second angle; and forming a third trench portion in the semiconductor substrate, wherein the third trench portion has a third sidewall that extends from the second sidewall at the second depth to a third depth in the semiconductor substrate, wherein an entire length of the third sidewall is disposed at a third angle, the third angle being defined between the third sidewall and the surface of the semiconductor substrate, and wherein the third angle is greater than zero and less than the first angle and the second angle.

9. The method of claim 8, filling the first, second, and third trench portions with a dielectric material.

10. The method of claim 8, filling the first, second, and third trench portions with a material, wherein the material in the second trench portion includes a void therein and the material in the first trench portion is free of the void.

11. The method of claim 10, wherein the third trench portion includes the void.

12. The method of claim 8, wherein the first angle is less than or equal to about 85°,
wherein the second angle is between about 90° and about 120°, and
wherein the third angle is less than or equal to about 45°.

13. The method of claim 8, wherein the third trench portion further includes a fourth sidewall that opposes the third sidewall, wherein the fourth sidewall has a length extending from the second depth to the third depth that is transverse to a top surface of the semiconductor substrate.

14. The method of claim 13, wherein fourth sidewall intersects the third sidewall at the third depth.

15. The method of claim 8, wherein the first trench portion has a width that tapers from a first width at the surface of the semiconductor substrate to a second width at the first depth, the first width being greater than the second width,
wherein the second trench portion has a width that is substantially equal to the second width from the first depth to the second depth, and
wherein the third trench portion has a width that tapers from the second width at the second depth to a point at the third depth.

16. A method comprising:
forming a first trench portion extending from a top surface of the semiconductor substrate to a first depth in the semiconductor substrate, wherein the first trench portion has a width that tapers from a first width at the surface of the semiconductor substrate to a second width at the first depth;

forming a second trench portion in the semiconductor substrate, wherein the second trench portion extends from the first depth to a second depth in the semiconductor substrate, wherein the second trench portion has substantially the second width from the first depth to the second depth; and forming a third trench portion extending from the second depth to a third depth in the semiconductor substrate, wherein the third trench portion includes a first sidewall extending from the second depth to the third depth and an opposing second sidewall extending from the second depth to the third depth such that the second sidewall physically contacts the first sidewall at the third depth, wherein the first and second sidewalls are transverse to the top surface of the semiconductor substrate.

17. The method of claim 16, forming a dielectric material in the first, second, and third trench portions, wherein the dielectric material in at least one the second and third trench portions includes a void therein, and wherein the dielectric material in the first trench portion is free of the void.

18. The method of claim 17, wherein the dielectric material in the second and third trench portions includes the void therein.

19. The method of claim 16, wherein forming the second trench portion and forming the third trench portion occur during a same etching process.

20. The method of claim 16, wherein the first trench portion includes a first angle between a third sidewall of the first trench portion and the top surface of the semiconductor substrate,
wherein the second trench portion includes a second angle between a fourth sidewall of the second trench portion and the top surface of the semiconductor substrate, wherein the first angle is less than the second angle, and
wherein an entire length of the first sidewall is disposed at a third angle, the third angle being defined between the first sidewall and the top surface of the semiconductor substrate, and wherein the third angle is greater than zero and less than the first angle and the second angle.

* * * * *